United States Patent
Ellá et al.

(10) Patent No.: US 10,277,259 B2
(45) Date of Patent: Apr. 30, 2019

(54) FRONT-END CIRCUIT FOR SIMULTANEOUS TRANSMISSION AND RECEPTION OPERATION

(71) Applicant: Snaptrack Inc., San Diego, CA (US)

(72) Inventors: Juha Ellá, Halikko (FI); Edgar Schmidhammer, Stein an der Traun (DE)

(73) Assignee: SnapTrack, Inc., San Diego, CA (US)

( * ) Notice: Subject to any disclaimer, the term of this patent is extended or adjusted under 35 U.S.C. 154(b) by 265 days.

(21) Appl. No.: 15/119,476

(22) PCT Filed: Jun. 3, 2014

(86) PCT No.: PCT/EP2014/061477
§ 371 (c)(1),
(2) Date: Aug. 17, 2016

(87) PCT Pub. No.: WO2015/128005
PCT Pub. Date: Sep. 3, 2015

(65) Prior Publication Data
US 2017/0012651 A1    Jan. 12, 2017

(30) Foreign Application Priority Data
Feb. 28, 2014  (DE) .................. 10 2014 102 699

(51) Int. Cl.
*H04B 1/00* (2006.01)
*H03H 7/46* (2006.01)
(Continued)

(52) U.S. Cl.
CPC .......... *H04B 1/0057* (2013.01); *H03H 7/465* (2013.01); *H04B 1/0064* (2013.01);
(Continued)

(58) Field of Classification Search
None
See application file for complete search history.

(56) References Cited

U.S. PATENT DOCUMENTS 8,938,026 B2    1/2015  Premakanthan et al.
9,312,888 B2    4/2016  Weissman et al.
(Continued)

FOREIGN PATENT DOCUMENTS

DE    60100421 T2    4/2004
DE    102011111951 A1    5/2012
(Continued)

OTHER PUBLICATIONS

International Search Report and Written Opinion—PCT/EP2014/061477—ISA/EPO—dated Oct. 23, 2014.
(Continued)

*Primary Examiner* — Mohammad S Adhami
(74) *Attorney, Agent, or Firm* — Patterson & Sheridan, L.L.P.

(57) ABSTRACT

A front end circuit is disclosed. In an embodiment, the circuit includes a first antenna connection and first to third signal paths, each of which include a tunable filter and each of which is connected to the first antenna connection. The circuit further includes at least one phase shifter arranged in at least one of the signal paths between a respective filter and the first antenna connection and a control circuit configured to tune frequency bands of the filters, wherein the filters are operable in a FDD operating mode or a TDD operating mode, and wherein the front-end circuit is simultaneous operable in at least one transmission band and at least one reception band using all three filters and the associated signal paths.

17 Claims, 5 Drawing Sheets

(51) Int. Cl.
*H04L 5/14* (2006.01)
*H03H 7/01* (2006.01)

(52) U.S. Cl.
CPC ......... *H04L 5/1461* (2013.01); *H03H 7/1708* (2013.01); *H03H 7/1775* (2013.01); *H03H 2210/025* (2013.01)

(56) References Cited

U.S. PATENT DOCUMENTS

| | | | |
|---|---|---|---|
| 2004/0127178 A1* | 7/2004 | Kuffner | H01P 1/15 455/133 |
| 2005/0088255 A1 | 4/2005 | Sengupta et al. | |
| 2009/0268647 A1* | 10/2009 | Uejima | H04B 1/0057 370/297 |
| 2011/0134810 A1 | 6/2011 | Yamamoto et al. | |
| 2012/0093044 A1 | 4/2012 | Ishida | |
| 2012/0112853 A1 | 5/2012 | Hikino et al. | |
| 2012/0302188 A1* | 11/2012 | Sahota | H04B 1/006 455/150.1 |
| 2013/0147574 A1 | 6/2013 | Wada | |
| 2013/0244591 A1 | 9/2013 | Weissman et al. | |
| 2014/0038531 A1* | 2/2014 | Hayafuji | H04B 1/0057 455/77 |
| 2014/0055210 A1* | 2/2014 | Black | H04B 1/525 333/132 |
| 2014/0092795 A1* | 4/2014 | Granger-Jones | H04L 5/08 370/297 |
| 2015/0009079 A1* | 1/2015 | Bojer | H01Q 9/145 343/745 |
| 2015/0162888 A1* | 6/2015 | Yunoki | H03H 7/0161 333/174 |

FOREIGN PATENT DOCUMENTS

| | | |
|---|---|---|
| FR | 2904911 A1 | 2/2008 |
| JP | H08172333 A | 7/1996 |
| JP | 2006340268 A | 12/2006 |
| JP | 2008072537 A | 3/2008 |
| JP | 2011120120 A | 6/2011 |
| JP | 2012100180 A | 5/2012 |
| JP | 2012199923 A | 10/2012 |
| WO | 2011004525 A1 | 1/2011 |
| WO | 2012020613 A1 | 2/2012 |
| WO | 2012027703 A2 | 3/2012 |
| WO | WO-2012140969 A1 | 10/2012 |
| WO | 2013142527 A1 | 9/2013 |
| WO | WO-2014005061 A1 | 1/2014 |

OTHER PUBLICATIONS

Brank, J. et al., "RF MEMS-Based Tunable Filters," John Wiley & Sons, Inc. Int. J RF and Microwave CAE 11:, May 2001, pp. 276-284.

Inoue, H. et al., "A Novel Tunable Filter Enabling Both Center Frequency and Bandwidth Tunability," Proceedings of the 42nd European Microwave Conference, Oct. 29-Nov. 1, 2012, pp. 269-272, Amsterdam, The Netherlands.

Kadota, M. et al., "Tunable Filters Using Wideband Elastic Resonators," IEEE Transactions on Ultrasonics, Ferroelectrics and Frequency Control, Oct. 2013, pp. 2129-2136, vol. 60., No. 10.

Wada, T. et al., "Tunable Isolator Using Variable Capacitor for Multi-Band System," 2013 IEEE MTT-S International Microwave Symposium Digest, Jun. 2013, 3 pages, Seattle, WA.

* cited by examiner

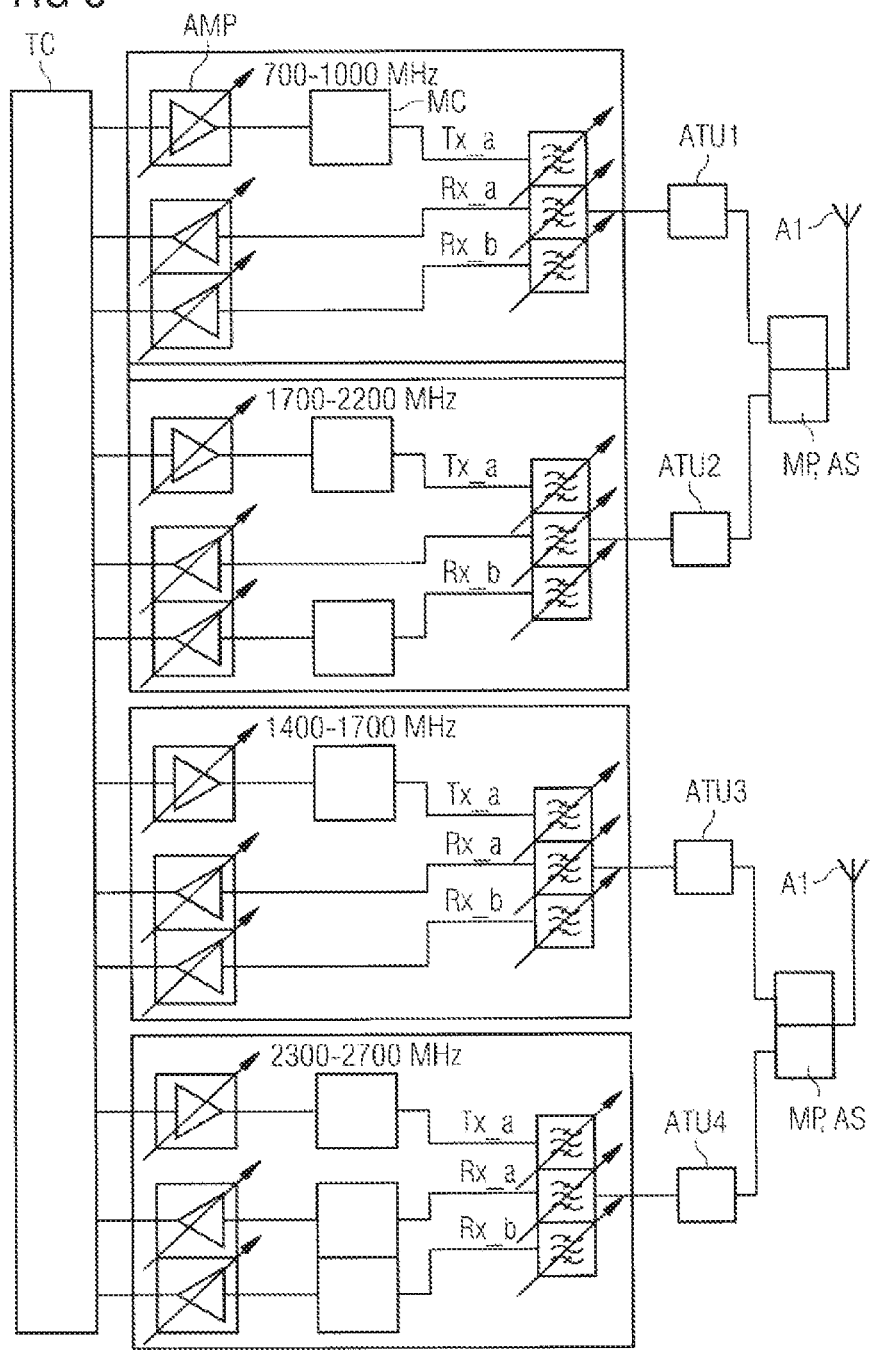

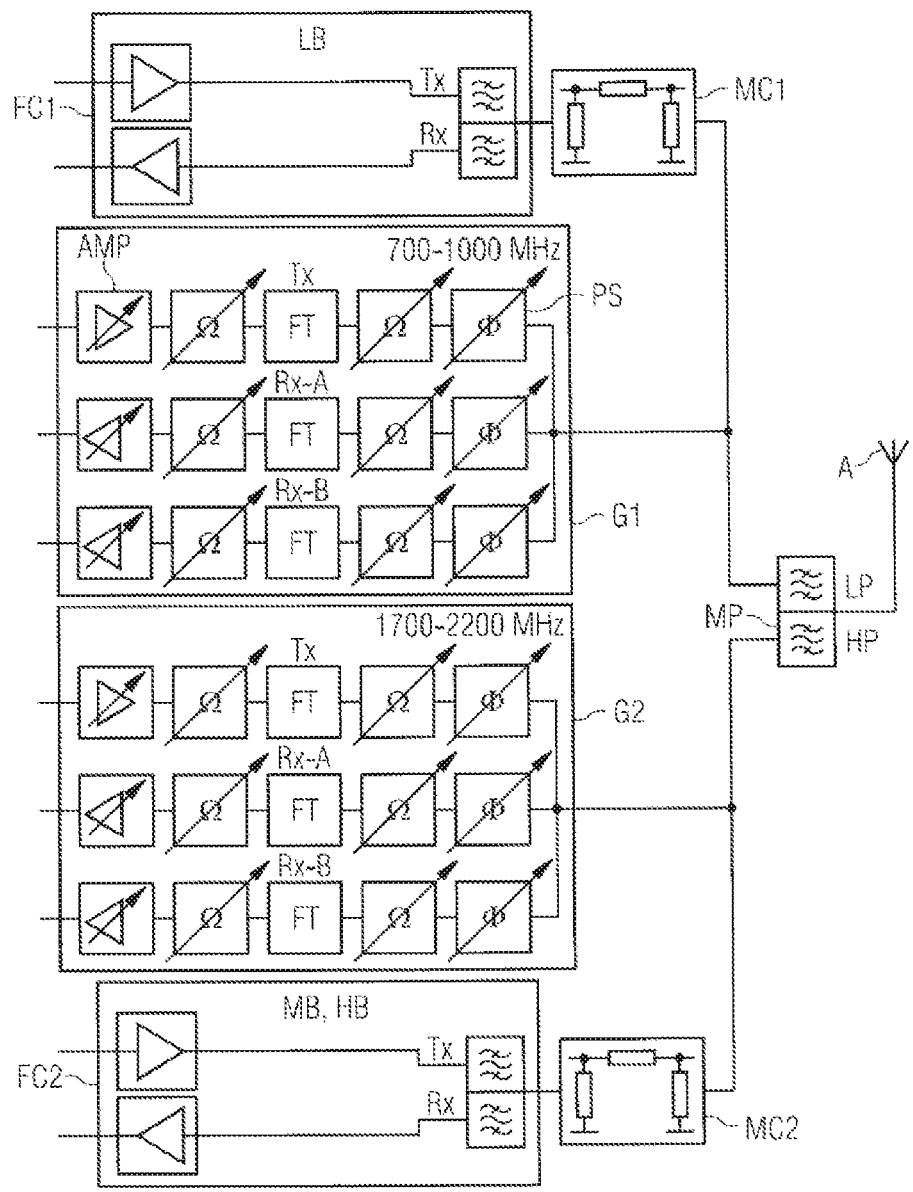

FRONT-END CIRCUIT FOR SIMULTANEOUS TRANSMISSION AND RECEPTION OPERATION

This patent application is a national phase filing under section 371 of PCT/EP2014/061477, filed Jun. 3, 2014, which claims the priority of German patent application 10 2014 102 699.3, filed Feb. 28, 2014, each of which is incorporated herein by reference in its entirety.

TECHNICAL FIELD

The invention relates to a front-end circuit having a tunable filter, as can be used in wire-less communication devices, for example. It also relates to a front-end circuit which enables a carrier aggregation mode in which it is possible to transmit or receive in three transmission or reception bands at the same time.

BACKGROUND

Portable communication devices, WLAN routers etc. or more generally: transmission/reception devices which communicate using RF signals, require RF filters in order to separate desired signals from undesired signals. Such filters can be connected, for example, in front-end circuits, for example in duplexers.

In this case, the front-end circuit should look after the task of distributing the signals between a chipset and filters which are possibly also present. The circuit complexity should be as low as possible. The filter should be compatible with a multiplicity of different filter technologies of further filters, should enable a small size of a corresponding component and, in particular, should allow high selectivity.

The trend for communication devices which can serve more and more frequency bands results in complex connections of different filters for the different frequency bands. Therefore, the need arises for tunable filters in order to be able to use different frequency bands with the same filter.

Previous solutions for these requirements are based substantially on expanding known filter circuits with tunable impedance elements or on the use of switches which can be used to connect filter elements to form a filter topology.

The article "Tunable Filters Using Wideband Elastic Resonators", Kadota et al., IEEE Transactions on Ultrasonics, Ferroelectrics and Frequency Control, Vol. 60, No. 10, October 2013, pages 2129-2136, discloses filter circuits in which tunable capacitors are added to RF filters having acoustic resonators.

The article "A Novel Tunable Filter Enabling Both Center Frequency and Bandwidth Tunability", Inoue et al., Proceedings Of The 42nd European Microwave Conference, Oct. 29-Nov. 1, 2012, Amsterdam, The Netherlands, pages 269-272, discloses RF filters having tunable capacitors and tunable inductances.

The article "RFMEMS-Based Tunable Filters", Brank et al., 2001, John Wiley & Sons, Inc. Int J RF and Microwave CAE11: pages 276-284, 2001, also discloses connections of L and C elements, the capacitances of the capacitive elements being adjustable.

The article "Tunable Isolator Using Variable Capacitor for Multi-band System", Wada et al., 978-1-4673-2141-9/13/$31.00, 2013 IEEE MTT-S Symposium and the published document WO2012/020613 disclose the use of isolators in RF filters.

In the LTE-A (Long-Term Evolution-Advanced) mobile radio standard, mobile telephones can be operated in the so-called carrier aggregation mode (CA) in order to enable high data rates during downlink and/or uplink operation. In the CA mode, transmission and reception operation is possible in a first frequency band, while reception can be carried out at the same time in a further frequency band. By convention, different band combinations were proposed for this purpose, preferably inter-band combinations in which the frequency bands differ considerably in the CA mode. The greater the frequency difference between the frequency bands to be combined in the CA mode, the easier the technical implementation.

Band combinations in which the frequency bands to be combined are in the same frequency range or in closely adjacent frequency bands have additionally been proposed. Promising technical implementations which can be implemented using a single antenna have not yet been proposed for such in-band CA modes.

SUMMARY OF THE INVENTION

Embodiments provide a front-end circuit having a tunable filter which covers a plurality of frequency bands. Further embodiments provide a front-end circuit which enables a simplified carrier aggregation mode.

In various embodiments of the invention, the front-end circuit has at least one first, one second and one third signal path which are coupled to an antenna connection. A filter whose frequency band can be tuned by means of a control circuit is arranged in each of the signal paths. The filters can either be operated in the FDD or TDD operating mode or may comply with a transmission standard which uses an FDD (=frequency division duplexing) or a TDD (=time division duplexing) operating mode. Each of the filters has a tuning range. Simultaneous operation in at least one transmission band and at least one reception band via all three filters is possible using the three signal paths and the tunable filters which are independent of one another.

Conventional combined operation in three bands comprises the transmission band and the reception band of a first mobile radio standard and additionally operation in the reception band of a further mobile radio standard. The bands which are connected to one another are preferably selected from those combinations which have already been proposed for the CA mode.

The antenna connection is an antenna-side connection at which the three signal paths are combined. The antenna connection may be coupled to an antenna directly or via further elements. According to one embodiment, all signal paths are coupled to the same antenna via the antenna connection.

The tuning range of the tunable filters is dependent on the Q factor of the components used therefore. With a sufficient Q factor of the components used, a factor of 2, for example, can be set for the tuning range, with the result that the highest frequency of the tuning range is twice as high as the lowest frequency of the tuning range. The tuning ranges of the three filters can match. However, it is also possible for at least one of the filters to only partially overlap the tuning range of another filter, to cover an adjacent tuning range or to be remote from the tuning range of one of the other filters as a result of a relatively large frequency gap.

Depending on the choice of the tuning ranges, both an in-band CA mode and an inter-band CA mode are possible with the proposed front-end circuit.

According to the preferred arrangement in the CA mode, the first filter is a TX filter, whereas the second and third filters are each RX filters.

According to one embodiment, all three filters have the same tuning range.

According to one embodiment, the tuning range of the first filter, that is to say the first tuning range, covers the range of 700 to 1000 MHz. The second filter covers the range of 1700 to 2700 MHz and therefore forms a second tuning range which is distinctly separate from the first tuning range. The third filter can be assigned to one of these two tuning ranges or may alternatively even have a third tuning range.

In another embodiment of the invention, the front-end circuit has a fourth signal path, in which a fourth tunable filter is arranged and which is coupled to the antenna connection. The fourth filter has a fourth tuning range which can overlap a tuning range of the first three filters, is identical to such a tuning range or is completely different from the tuning ranges of the first three filters.

If two of the filters are in the form of TX filters and the remaining two filters are in the form of RX filters, parallel operation in two mobile radio standards is achieved with this embodiment, operation comprising simultaneous transmission and reception in the respective frequency bands. This makes it possible to double the data rate both for the uplink and for the downlink.

One RX filter and one TX filter are preferably selected and connected to one another in such a manner that duplex operation in a mobile radio standard is possible. Accordingly, the tunable filters used for this purpose can be adjusted within the same tuning range provided that the tuning range comprises the RX band and TX band of the mobile radio standard. Transmission and/or reception operation in another frequency band is possible in one or two further filters, that is to say a third and a fourth filter. The other frequency band may be in the same tuning range, with the result that the same filters can be used for this purpose. However, it is also possible to use filters having other tuning ranges for this purpose, the tuning ranges of which are adjacent to or far away from the tuning ranges of the two first filters.

An antenna tuner may be arranged between the tunable filter and the antenna connection or between the antenna connection and the antenna. If the filters in the signal paths connected to the common antenna connection have identical or similar tuning ranges, the same common antenna tuner can be used for all filters or for all frequency bands to which the filters are tunable, which antenna tuner is then arranged at a point between the antenna and the respective filter before the signal paths branch.

If the filters connected to the common antenna connection have tuning ranges which differ greatly from one another, separate antenna tuners can be used for each tuning range. This makes it possible to configure the antenna tuners to be narrowband, with the result that simpler adaptation with fewer losses is possible.

According to further embodiments, it is also possible to dispense with the antenna tuner. The tunable filter(s) can then each comprise a filter circuit in which not only the frequency or the frequency band is adjustable but rather the filters are also additionally adapted to the antenna.

According to one embodiment of the invention, the front-end circuit comprises two different antenna connections which can be coupled to a common antenna via a multi-plexer or an antenna switch. A diplexer which comprises a high-pass filter and a low-pass filter can be used for two antenna connections.

According to the previous exemplary embodiments, three or more signal paths having tunable filters arranged therein are connected to each of the two antenna connections. This makes it possible to couple six or more tunable filters to the same antenna, at least three of the filters being in a first frequency range, while the remaining three or more filters are in a second frequency range which can be passively separated from the first frequency range via the diplexer.

If the diplexer is replaced with an antenna switch which, for each switching position, connects the antenna to one of two antenna connections, operation can be effected only via those signal paths which are connected to the selected antenna connection and only in those frequency ranges in which the corresponding filters are tunable. If an antenna switch is provided, the tuning ranges of the three filters can overlap, unlike in the case of a diplexer, may be adjacent or may also be separated with a greater spacing in terms of frequency.

In another embodiment of the invention, the front-end circuit may provide a second antenna and, connected to the latter, one or two antenna connections which may each be designed as described above, for example.

Each signal path connects an antenna connection to an RF chip which comprises a transceiver circuit, for example. The signal processing for the transmission and reception operation takes place in the transceiver circuit. In addition, a power amplifier or an LNA (low-noise amplifier) may be arranged in each signal path between the RF chip.

According to one embodiment, an impedance matching circuit may be provided between the power amplifier or the LNA and the respective filter, but said impedance matching circuit is optional and may be dispensed with in other embodiments. The impedance matching circuit may be used only in transmission paths, for example. However, it is also possible to respectively provide an impedance matching circuit in all signal paths of the front-end circuit, preferably between the amplifier and the filter. It is also possible to carry out the impedance matching in the filter itself and to configure the filter such that it can be matched with respect to the impedance.

The tunable filters are preferably each in the form of a filter circuit and are implemented as a connection of "lumped elements" such as capacitances and inductances. Each filter circuit has, for example, a plurality of LC resonant circuits implemented from high-quality L and C elements. A high-quality L or C component, that is to say a high-quality capacitance and a high-quality inductance, is understood as meaning those components having a high Q factor of 100 or more, for example. Such Q factors can be used to implement the mentioned tuning ranges with a factor of 2. If an L or C component has an even higher Q factor, this naturally has a positive effect on the tuning range and also a positive effect on the losses of the filter circuit.

The filter circuits used in the front-end circuit may comprise a serial signal line having at least four circuit nodes. A parallel branch to ground is coupled to each of these circuit nodes. A high-quality tunable reactance element is arranged in each parallel branch. The reactance elements coupled to the serial signal line are coupled to one another, at least capacitive and possibly also inductive coupling being allowed. Capacitive coupling can be effected via coupling capacitors which are arranged in the serial signal line between two adjacent circuit nodes in each case.

The terminally arranged circuit nodes on both sides in the serial signal line are connected to one another via a bridging inductance connected in parallel with the serial signal line.

The Q factors of the coupling capacitors and of the bridging inductance need not satisfy such high demands as the Q factors of the reactance elements.

The reactance elements may be in the form of parallel resonant circuits each comprising a parallel circuit of a high-quality tunable capacitor and a high-quality inductance. A high-quality tunable capacitor may be in the form of a semiconductor circuit and may comprise a varactor, for example. A varactor is a semiconductor component whose capacitance can be adjusted using analog control, for example.

Furthermore, a tunable capacitor may be in the form of a switchable capacitor array. Such a capacitor array may comprise conventional MIM (metal insulator metal) capacitors or may have capacitors in the form of MEMS capacitors. The latter may also be integrated in a semiconductor substrate and may therefore be part of the semiconductor circuit.

In order to enable interference-free parallel operation in the three or more signal lines connected to the same antenna connection, those frequencies which are assigned to the other signal paths or to the filters arranged in the latter must be attenuated in the respective signal path.

Such attenuation can be carried out, for example, using a tunable phase shifter circuit which is arranged between the tunable filter and the respective antenna connection. The phase shifter circuit rotates the phase of all of those frequencies which are not intended to be transmitted in the respective signal path in the direction of open. The phase shifter remains virtually ineffective for the frequency which is to be transmitted and to which the respective filter is set, with the result that signals at the corresponding frequency can pass through the phase shifter circuit virtually without attenuation. This means that each signal line transmits only those frequency components to which the tunable filter is set with a low insertion loss. The interaction resulting from the set center frequency of the tunable filters and of the optimally adjusted phase shifters therefore allows the implementation of multi-band filters having very good properties with respect to insertion loss and selectivity.

In this case, in addition to the center frequency of the filter, the required phase angle of the tunable phase shifter also depends on the input and output impedances of the tunable filter. The smallest possible phase angle will be expediently selected in order to keep the transmission losses as low as possible.

However, the phase shifter circuit may also be part of the filter circuit. In this case, it is possible to use a single control signal to both set the filter to the desired frequency within the tuning range and to simultaneously adjust the phase for the frequencies to be blocked in such a manner that the filter transfer curves are optimal.

However, the tunable phase shifter circuit may also be separate from the tunable filter and may be controlled separately. The respective required setting of the phase shifter circuit can be carried out using a control element or a control circuit which carries out corresponding settings in the phase shifter circuit for the respective band combination. Such settings may be predefined for the desired band combination to be set and may be stored, for example, in a look-up table which contains a list containing parameters to be set.

However, it is also possible to adjust the phase shifter circuit individually using measured operating parameters or operating parameters acquired in another manner.

BRIEF DESCRIPTION OF THE DRAWINGS

The invention is explained in more detail below using exemplary embodiments and the associated figures. The figures are only schematic and are used only for a better understanding of the invention. For the sake of clarity, various components are possibly not illustrated, but their need is known to a person skilled in the art or is clear from the overall context. Elements of the front-end circuit which have not been described in any more detail are presumed to be known, with the result that they do not require any further explanation in terms of their function and structure.

FIG. 8 shows a front-end circuit having two antennas and four antenna connections, FIG. 9 shows a tunable filter having an impedance which is tunable on the input and output sides, FIG. 10 shows a front-end circuit having an antenna which manages without an antenna tuner.

DETAILED DESCRIPTION OF ILLUSTRATIVE EMBODIMENTS

Figure 1:
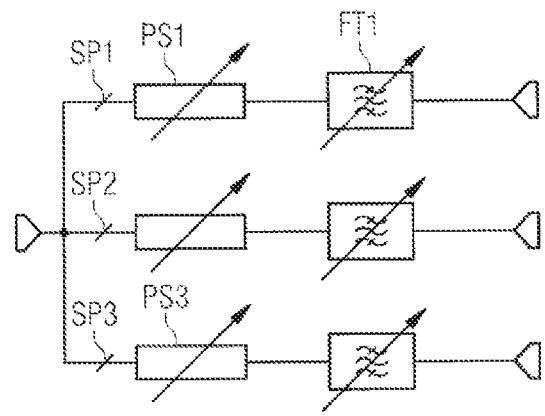
FIG. 1 shows a simple block diagram of a front-end circuit having three signal paths.

FIG. 1 shows the block diagram of a simple front-end circuit in which three signal paths SP1 to SP3 are connected to a common antenna connection AT. A tunable filter FT is arranged in each signal path SP. A phase shifter circuit PS1, PS2, PS3 which is tunable is additionally respectively arranged between the tunable filter and the antenna connection. The other ends of the signal paths SP which are opposite the antenna connection AT can be connected to one or more RF chips, for example a transceiver circuit. Each of the tunable filters FT is preferably in the form of a tunable bandpass filter. Each of the filters has a tuning range, the tuning ranges of the three filters illustrated being able to be identical.

Figure 2:
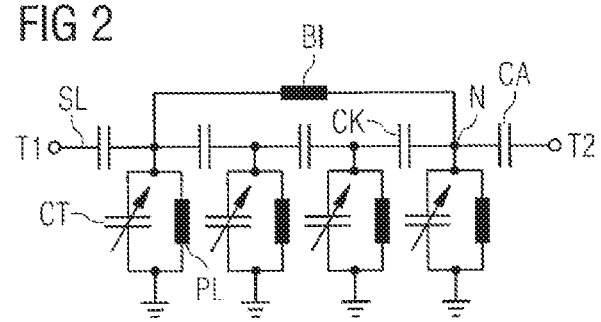
FIG. 2 shows a filter circuit which can be used to implement a tunable filter.

FIG. 2 shows a possible embodiment of a tunable filter circuit FT. A serial signal line SL is connected between a first and a second connection T1, T2. The signal line has four circuit nodes N, to each of which a parallel branch to ground is connected. Each parallel branch comprises a tunable capacitance CT and, in parallel with the latter, an inductance PL. A coupling capacitance CA which is in the form of a coupling capacitor, for example, is provided between two circuit nodes N which are adjacent to one another in the signal line SL.

Alternatively, a coupling inductance which can serve the same purpose may be provided.

Coupling capacitances CA, that is to say capacitive elements which couple resonant circuits, may have a capacitance of between 10 fF and 100 pF. Coupling inductances, that is to say inductive elements which couple resonant circuits, may have an inductance of between 1 nH and 300 nH.

The two terminal circuit nodes N of the signal line SL are connected to a bridging inductance BI which is connected in parallel with the signal line SL. A termination capacitance CA which can be set to be tunable and can be used for impedance matching to the circuit environment is respectively provided beyond the outermost circuit nodes.

Figure 3:
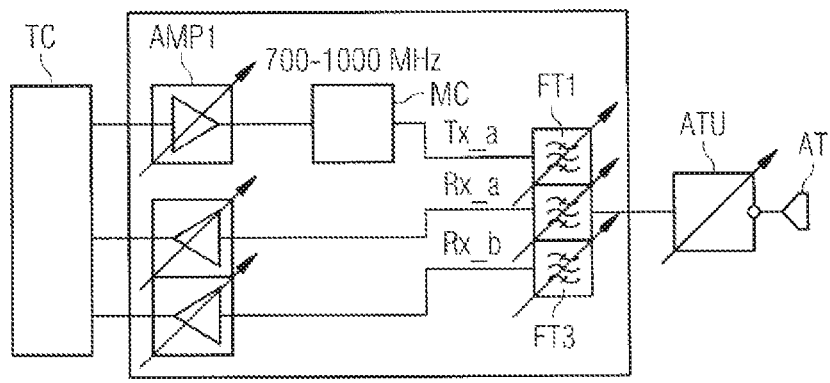
FIG. 3 shows a more complex front-end circuit having further components.

FIG. 3 shows further components of the front-end circuit which can be implemented on a common substrate as a front-end module. As already described, each of the signal paths SP connects a common antenna connection AT to an RF chip TC, for example a transceiver circuit. A preferably tunable amplifier AMP which is in the form of a power amplifier for a transmission path and is in the form of an LNA for a reception path is arranged between the filter FT and the transceiver circuit TC in each signal path SP. A tunable amplifier has the advantage that it may be narrow-band and can be matched to the frequency band (passband) respectively set in the filter. This minimizes the losses in the amplifier and reduces interference signals.

Furthermore, an impedance matching circuit MC may be arranged in the signal path between the amplifier AMP and the tunable filter FT. This impedance matching circuit may be implemented from passive components in a manner known per se. However, it is also possible to dispense with such an impedance matching circuit MC with an optimally matched amplifier and a tunable filter.

At least one antenna tuner ATU may be arranged between the antenna connection AT and the filter. This tuner is preferably likewise tunable and can be tuned to the respectively set frequency bands.

Figure 4:
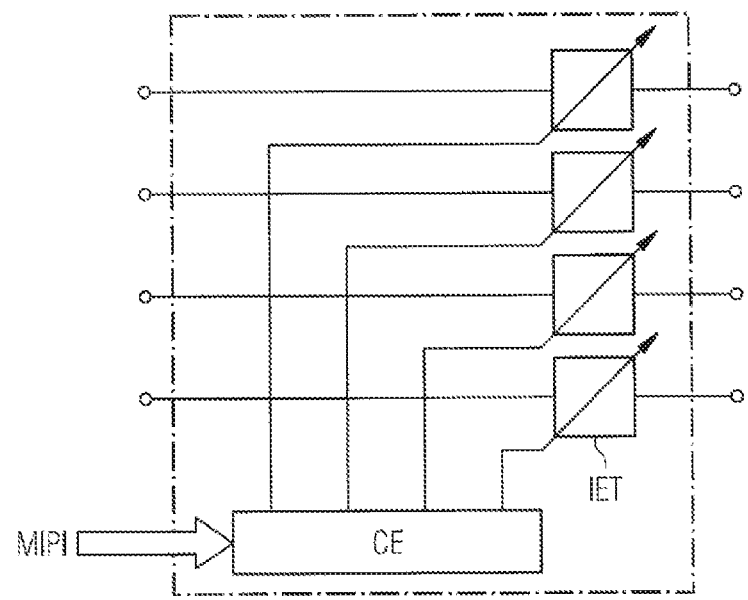
FIG. 4 shows a series of tunable capacitors, as can be used in a filter circuit.

FIG. 4 shows an array of four tunable high-quality impedance elements IET which are controlled by a common control unit CE. The arrangement may also comprise a greater number of tunable impedance elements IET. The tunable impedance elements IET have a tunable impedance. They are, for example, in the form of tunable capacitances which are tunable in terms of their capacitance value. The information for tuning can be sent, via an MIPI-RFFE signal (MIPI), to the control unit CE which then accordingly tunes the individual tunable capacitors CT or simply more generally the impedance elements IET. The tunable impedance elements can be implemented in different technologies. The entire arrangement may be implemented in a semiconductor component. The control unit CE generates control for the tunable capacitors from the MIPI-RFFE signal.

Each of the tunable impedance elements may be a connection of a tunable impedance element to one or more further passive components.

Figure 5:
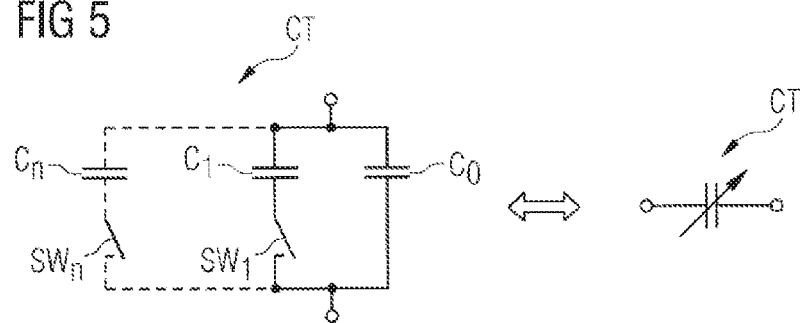
FIG. 5 shows a switchable capacitor array.

FIG. 5 shows a possibility of how a tunable capacitance CT can be in the form of a switchable capacitor array. This capacitor array comprises a basic capacitance C0, in parallel with which a first additional capacitance $C_1$ can be connected with the aid of a first switch SW1. The total capacitance of this parallel circuit corresponds to the sum of the capacitances $C_0$ and $C_1$. In an expansion of this switchable array, further capacitors $C_n$ can be connected in parallel by means of further switches $SW_n$, the capacitances of all individual capacitors connected in parallel being added. A particular capacitance value, and via this capacitance value, the resonant frequency of a resonant circuit, which is part of a tunable filter circuit FC, can be set by varying the capacitance value of the connectable capacitors and by the number of capacitors connected in parallel. The right-hand part of the figure illustrates the circuit symbol for a tunable capacitor CT.

Figure 6:
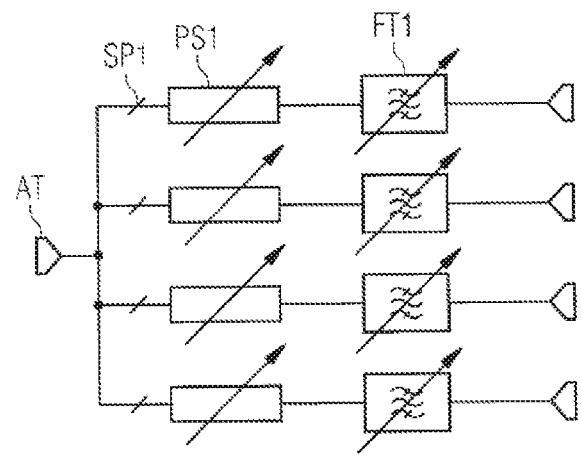
FIG. 6 shows a front-end circuit having four signal paths.

FIG. 6 shows a front-end circuit which is similar to FIG. 1 but has been expanded by a fourth signal path SP4. This front-end circuit may otherwise be configured as described using FIG. 1. In this case too, a tunable phase shifter circuit PS is respectively arranged between the antenna connection AT and the tunable filter FT and is integrated in the signal path SP. In this case too, the four different tunable filters may have different tuning ranges and may be provided for a common tuning range.

Figure 7:
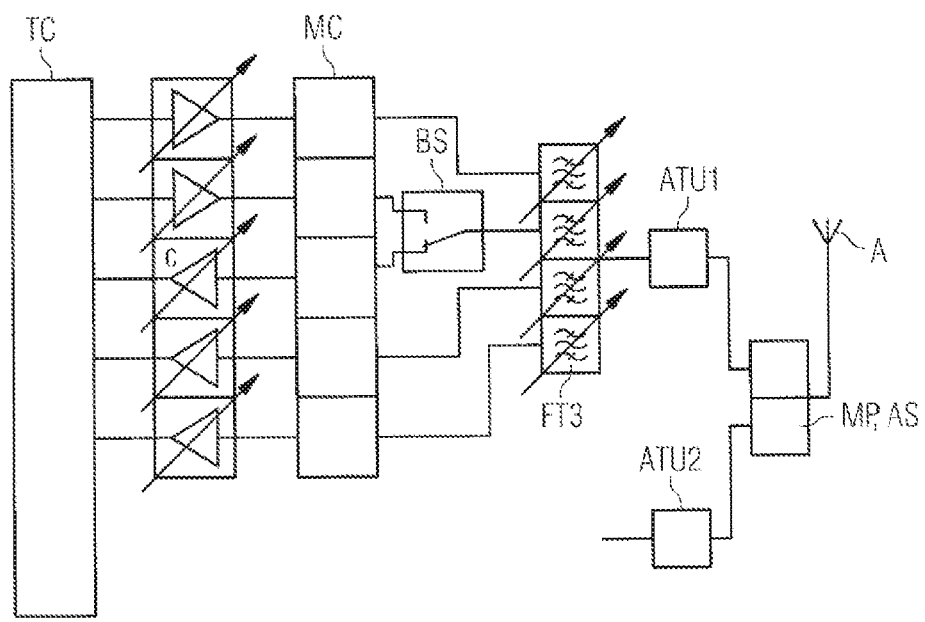
FIG. 7 shows a further embodiment of a front-end circuit having four signal paths.

FIG. 7 shows an expanded front-end circuit using the partial circuit illustrated in FIG. 6. An antenna tuner ATU1 is optionally provided between the tunable filters FT and the antenna connection (not illustrated in the figure). The antenna connection is here the transceiver-side output of a multiplexer MP which is connected to the antenna A via the multiplexer. The multiplexer may be in the form of a diplexer, for example. The diplexer then has a second antenna connection which is remote from the antenna and to which a further optional antenna tuner is or can be connected, further signal paths SP with tunable filters arranged therein being connected or being able to be connected to said antenna tuner. However, the multiplexer may also be in the form of an antenna switch AS which optionally connects the antenna A to one of the two antenna tuners ATU.

The respective other end of the four signal paths connected to one respective common antenna connection leads to an RF chip, for example a transceiver TC. An amplifier AMP which again may be in the form of a power amplifier or an LNA may also be arranged in each signal path between the tunable filter FT and the transceiver TC. An impedance matching circuit MC may also be provided in each of the signal paths between the amplifier and the tunable filter FT.

FIG. 7 also provides an optional configuration in which a signal path can be divided between two different signal path elements between the RF chip TC and the tunable filter FT via a band switch BS. Each signal path element comprises its own amplifier and optionally its own impedance matching circuit MC. One of the two signal path elements can be selected via the band switch BS. For example, it is possible to form one of the two signal path elements as a transmission path and to form the other as a reception path. These can together constitute, for example, the transmission and reception path for a TDD mobile radio standard, the band switch BS then simultaneously changing over between transmission operation and reception operation. The changing-over of the band switch BS may be associated with tuning of the tunable filter FT. However, it is also possible to select only the type of amplifier and a corresponding input of the transceiver TC by means of the band switch BS.

A further antenna tuner may be connected to the second output of the multiplexer MP or of the antenna switch AS and further signal paths may be connected to the further antenna tuner, as described above. This makes it possible to connect a maximum of eight different frequency bands to the antenna at the same time. This is easy when there is a sufficiently large frequency spacing between the tuning ranges of the filters connected to the first antenna tuner or the first antenna connection and the tuning ranges of the filters connected to the second antenna connection, with the result that the respective frequencies can be cleanly separated from one another.

FIG. 8 shows a front-end circuit configured further for an embodiment having two antennas A1, A2. As illustrated in FIG. 7, each antenna A is connected to a multiplexer MP or to an antenna switch AS which respectively provides two antenna connections at the output. As described in FIG. 3, each of the antenna connections can be connected to three signal paths which are connected to a transceiver TC via a tunable filter, tunable amplifiers and possibly impedance matching circuits MC. As illustrated in FIG. 3, two circuits which can be controlled passively via the multiplexer or actively via the antenna switch are therefore connected to the first antenna A1. In the same manner as in FIG. 3, two front-end circuits which can likewise be controlled via a multiplexer MP or an antenna switch AS are likewise connected to the second antenna A2.

If a separate frequency range is assigned to each of the four antenna connections illustrated here, together with the signal paths connected thereto, the arrangement which is illustrated in FIG. 8 and can be implemented in a single front-end circuit can be used to cover four different frequency ranges or to receive or transmit transmission and reception signals in these frequency ranges. For example, the frequency range of the complex illustrated at the top of FIG. 8 can be set to a frequency range of 700 to 1000 MHz which corresponds to the tuning range of the three tunable filters. The section which is arranged underneath and is connected to the same antenna A1 can have signal paths or tunable filters arranged in the latter tuned to a frequency range of 1700 to 2200 MHz.

A first complex of three signal lines having tunable filters arranged therein can be connected to the second antenna A2 via an antenna connection AT, which complex covers a tuning range of 1400 to 1700 MHz. The signal paths or the filters arranged therein, which are connected to the second antenna connection, may be tuned to a further frequency range which covers the frequencies of 2300 to 2700 MHz. In this manner, the arrangement can serve all common frequency bands and, since there are two antennas, four power amplifiers (PA) and eight LNAs, can transmit at at least four different frequencies at the same time and can additionally receive in eight different frequency bands.

FIG. 9 shows a further possible configuration of a tunable filter circuit FT, as can be arranged in each of the tunable signal paths. In addition to the frequency tuning, the circuit also has, on the input and output sides, impedance matching circuits MC which are integrated in a tunable filter circuit as illustrated in FIG. 2, for example. These matching means may be in the form of tunable impedance elements, for example tunable capacitors.

FIG. 10 shows a further configuration. A diplexer MP which provides virtually two antenna connections at its outputs is connected to an antenna A. A group G1, G2 of three or more signal paths is coupled to each of the two outputs or antenna connections. Each group of signal paths has tunable filters FT, the tuning ranges of the tunable filters in a group being assigned to the same frequency range, but the two groups being assigned to different frequency ranges.

The two groups or the tuning ranges of the filters inside the two groups are assigned to two different frequency ranges selected from the range of less than 700 MHz, the range from 700 MHz to 1000 MHz, the range from 1000-1400 MHz, the range from 1400-1700 MHz, the range from 1700-2200 MHz, the range from 2200-2700 MHz and the range above 2700 MHz.

Each tunable filter is designed as illustrated in FIG. 9, for example. Each signal path additionally also has, on the antenna side, a phase shifter circuit PS whose phase angle can be tuned. The diplexer MP is able to separate the two frequency ranges and to allocate corresponding signals within one of the frequency ranges to the corresponding group of signal paths. A phase shifter circuit is arranged between the filter and the antenna connection in the respective signal path, whereas an amplifier AMP which is optionally tunable is arranged in each signal path at the end remote from the antenna. The filter can be optimally matched to the load impedance by means of the tunable filters which, according to FIG. 9, are additionally designed with a tunable input and output impedance. An antenna tuner is not required in this embodiment. The circuit is suitable and usable both for TDD operation and for FDD operation.

Inside each group of signal paths, at least one signal path, together with the tunable filter, is designed for transmission operation, that is to say as a Tx path, while at least one other signal path in the group G is designed as a reception path, that is to say as an Rx path.

As illustrated in FIG. 10, the arrangement may also be supplemented with two fixed filter circuits FC1, FC2 each connected to one of the two outputs of the duplexer MP. Each fixed filter circuit has a filter fixedly set to a frequency band and a corresponding amplifier. The filter may also be a duplexer. The filter may be an acoustic filter. A matching network which matches the impedance and phase of the fixed filter circuit to the antenna and the load is connected between the fixed filter circuit FC and the diplexer.

The additional filter circuits FC may be assigned to the same frequency range as the group of signal paths connected to the same output of the duplexer. A carrier aggregation operating mode is therefore possible, in which bands inside the same frequency range can be simultaneously used for a mobile radio connection.

A carrier aggregation operating mode with bands which are in different frequency ranges and can transmit at the same time is already possible with the two groups G1, G2 of signal paths which are indeed assigned to different frequency ranges.

It is also possible to assign the additional filter circuits FC to bands outside the two frequency ranges.

The invention has been described only using a few exemplary embodiments and is not restricted to the latter. Further components and elements as are conventional for common front-end circuits may be integrated in each of the signal paths illustrated or in each arrangement having the signal paths.

The tunable filters can be implemented in different technologies. It is also possible to use different technologies inside a single front-end circuit.

All tunable components of the filter circuit may be implemented in a single component, that is to say in a single semiconductor circuit. However, it is advantageous to divide the components between different components according to their type and/or the Q factor required and to mount them on the front-end module. It is advantageous, for example, to form high-quality inductances as discrete coils and therefore as discrete components.

The tunable high-quality capacitors may be provided together in one component in which further components of the filter circuits, the antenna tuners or the impedance matching circuits or the multiplexers or antenna switches can be integrated.

Low-quality components of the proposed front-end circuits may also be in the form of integrated passive components. However, it is also possible to at least partially integrate low-quality passive components in the substrate of the front-end circuit.

The invention claimed is:

1. A front-end circuit comprising:
   a first antenna connection;
   a first signal path with a first tunable filter arranged therein and coupled to the first antenna connection;
   a second signal path with a second tunable filter arranged therein and coupled to the first antenna connection;
   a third signal path with a third tunable filter arranged therein and coupled to the first antenna connection, wherein at least one of the first tunable filter, the second tunable filter, or the third tunable filter comprises a series signal path comprising a plurality of circuit nodes, each of the circuit nodes connected to electrical ground through a parallel circuit having a tunable capacitive element in parallel with an inductive element, the tunable capacitive element and the inductive elements having first terminals coupled to the series signal path and second terminals coupled to electrical ground, wherein the plurality of circuit nodes comprises at least four circuit nodes, and wherein end circuit nodes of the plurality of circuit nodes are connected to one another via a bridging inductance connected in parallel with the series signal path;

at least one phase shifter arranged in at least one of the first, second, or third signal paths between a respective filter and the first antenna connection; and a control circuit configured to tune frequency bands of the first tunable filter, the second tunable filter, and the third tunable filter.

2. The front-end circuit according to claim 1, wherein the first tunable filter is a transmit (Tx) filter, and wherein the second and third tunable filters are receive (Rx) filters.

3. The front-end circuit according to claim 1, wherein a tuning range of each of the first tunable filter, the second tunable filter, and the third tunable filter is selected from the group consisting of a range of less than 700 MHz, a range of 700 MHz to 1000 MHz, a range of 1000-1400 MHz, a range of 1400-1700 MHz, a range of 1700-2200 MHz, a range of 2200-2700 MHz, and a range above 2700 MHz.

4. The front-end circuit according to claim 1, further comprising a fourth signal path with a fourth tunable filter arranged therein and coupled to the first antenna connection.

5. The front-end circuit according to claim 4, wherein the fourth tunable filter has a fourth tuning range, and wherein the fourth tuning range overlaps with each tuning range of each of the first tunable filter, the second tunable filter, and the third tunable filter.

6. The front-end circuit according to claim 1, wherein the front-end circuit is operable in a duplex operation via a receive (Rx) filter and a transmit (Tx) filter of the first and second tunable filters, wherein an Rx frequency band and a Tx frequency band for the duplex operation are selectable, and wherein the third tunable filter is operable in an Rx mode or a Tx mode and in a frequency band which differs from the Tx and Rx frequency bands used for the duplex operation.

7. The front-end circuit according to claim 1, further comprising an antenna tuner arranged in at least one of the first, second, or third signal paths between a respective filter and the first antenna connection.

8. The front-end circuit according to claim 1, further comprising:
a second antenna connection;
a fourth signal path with a fourth tunable filter arranged therein and coupled to the second antenna connection;
a fifth signal path with a fifth tunable filter arranged therein and coupled to the second antenna connection; and
a sixth signal path with a sixth tunable filter arranged therein and coupled to the second antenna connection,
wherein the first and second antenna connections are connected to outputs of a multiplexer or an antenna switch, and
wherein a common input of the multiplexer or the antenna switch is coupled to an antenna.

9. The front-end circuit according to claim 1, further comprising an RF chip, wherein the RF chip is coupled to the first antenna connection via the first, second, and third signal paths, and wherein a power amplifier or an LNA is arranged between the RF chip and a filter in each signal path.

10. The front-end circuit according to claim 9, further comprising an impedance matching circuit arranged in each signal path between the power amplifier or the LNA and the filter.

11. The front-end circuit according to claim 1, wherein each tunable filter comprises a filter circuit, and wherein each filter circuit comprises capacitances and inductances forming a plurality of LC resonant circuits.

12. The front-end circuit according to claim 1, wherein the parallel circuits are coupled to one another via coupling capacitors arranged in the series signal path between two adjacent circuit nodes of the plurality of circuit nodes.

13. The front-end circuit according to claim 1, wherein the tunable capacitive elements are varactors or a switchable capacitor array.

14. The front-end circuit according to claim 13, wherein each of the at least one phase shifter and each of the first tunable filter, the second tunable filter, and the third tunable filter are connected to the control circuit and are tunable by a control signal from the control circuit.

15. A front-end circuit comprising:
a first antenna connection and a second antenna connection to each of which a group of three signal paths is connected, each signal path connecting an RF chip to one of the first and second antenna connections, wherein each of the three signal paths comprises:
a tunable amplifier;
a tunable filter whose input and output impedances are tunable;
a phase shifter circuit, two of the groups of the three signal paths covering two different frequency ranges, and each group comprising at least one tunable transmit (Tx) filter and one tunable receive (Rx) filter, wherein the tunable Tx filter or the tunable Rx filter comprises a series signal path comprising a plurality of circuit nodes, each of the circuit nodes connected to electrical ground through a parallel circuit having a tunable capacitive element in parallel with an inductive element, the tunable capacitive element and the inductive elements having first terminals coupled to the series signal path and second terminals coupled to electrical ground, wherein the plurality of circuit nodes comprises at least four circuit nodes, and wherein end circuit nodes of the plurality of circuit nodes are connected to one another via a bridging inductance connected in parallel with the series signal path; and
a diplexer connected to the first and second antenna connections.

16. The front-end circuit according to claim 15, wherein the diplexer is tunable.

17. The front-end circuit according to claim 15, further comprising a fixed frequency signal path having an acoustic filter, wherein the fixed frequency signal path is connected to at least one of the first and second antenna connections via a matching network.

* * * * *